US 6,690,232 B2

(12) United States Patent  
Ueno et al.

(10) Patent No.: US 6,690,232 B2
(45) Date of Patent: Feb. 10, 2004

(54) VARIABLE GAIN AMPLIFIER

(75) Inventors: Takashi Ueno, Kawasaki (JP); Tadashi Arai, Yokohama (JP); Tetsuro Itakura, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/210,057

(22) Filed: Aug. 2, 2002

(65) Prior Publication Data

US 2003/0058048 A1 Mar. 27, 2003

(30) Foreign Application Priority Data

Sep. 27, 2001 (JP) ........................................ 2001-295369

(51) Int. Cl.$^7$ ................................................ H03F 1/36
(52) U.S. Cl. ........................................ 330/85; 330/141
(58) Field of Search ........................... 330/85, 86, 141, 330/254, 260, 281, 282, 294

(56) References Cited

U.S. PATENT DOCUMENTS

| 4,884,141 A | * | 11/1989 | Hyakutake | 348/678 |
|---|---|---|---|---|
| 5,128,629 A | * | 7/1992 | Trinh | 330/129 |
| 5,697,074 A | * | 12/1997 | Makikallio et al. | 455/126 |
| 5,867,777 A | | 2/1999 | Yamaji et al. | 455/234.1 |
| 6,014,180 A | * | 1/2000 | Kawano | 348/678 |
| 6,208,209 B1 | * | 3/2001 | Ng | 330/279 |
| 6,437,643 B1 | * | 8/2002 | Ueno et al. | 330/85 |

OTHER PUBLICATIONS

Remco J. Wiegerink, et al., "Offset Cancelling Circuit", IEEE Journal Of Solid–State Circuits, vol. 24, No. 3, Jun. 1989, pp. 651–658.
Jarkko Jussila, et al., "A Channel Selection Filter for a WCDMA Direct Conversion Receiver", Proceedings of ESSCIRC '00, Sep. 2000, pp. 236–239.

* cited by examiner

*Primary Examiner*—My-Trang Nu Ton
(74) *Attorney, Agent, or Firm*—Oblon, Spivak, McClelland, Maier & Neustadt, P.C.

(57) ABSTRACT

A variable gain amplifier device comprises a variable gain amplifier circuit which amplifies a difference between an input signal and a feedback signal to output an output signal, a feedback circuit which supplies the feedback signal to the variable gain amplifier circuit, and a controller which controls the variable gain amplifier circuit and the feedback circuit to decrease a cutoff frequency of the feedback circuit according to increase of a gain of the variable gain amplifier circuit or vice versa.

15 Claims, 5 Drawing Sheets

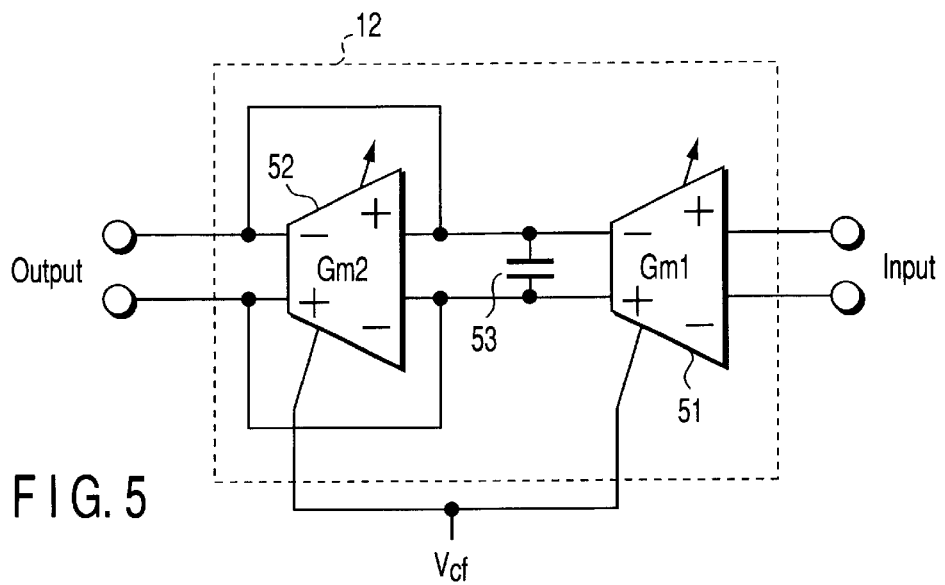
FIG. 5
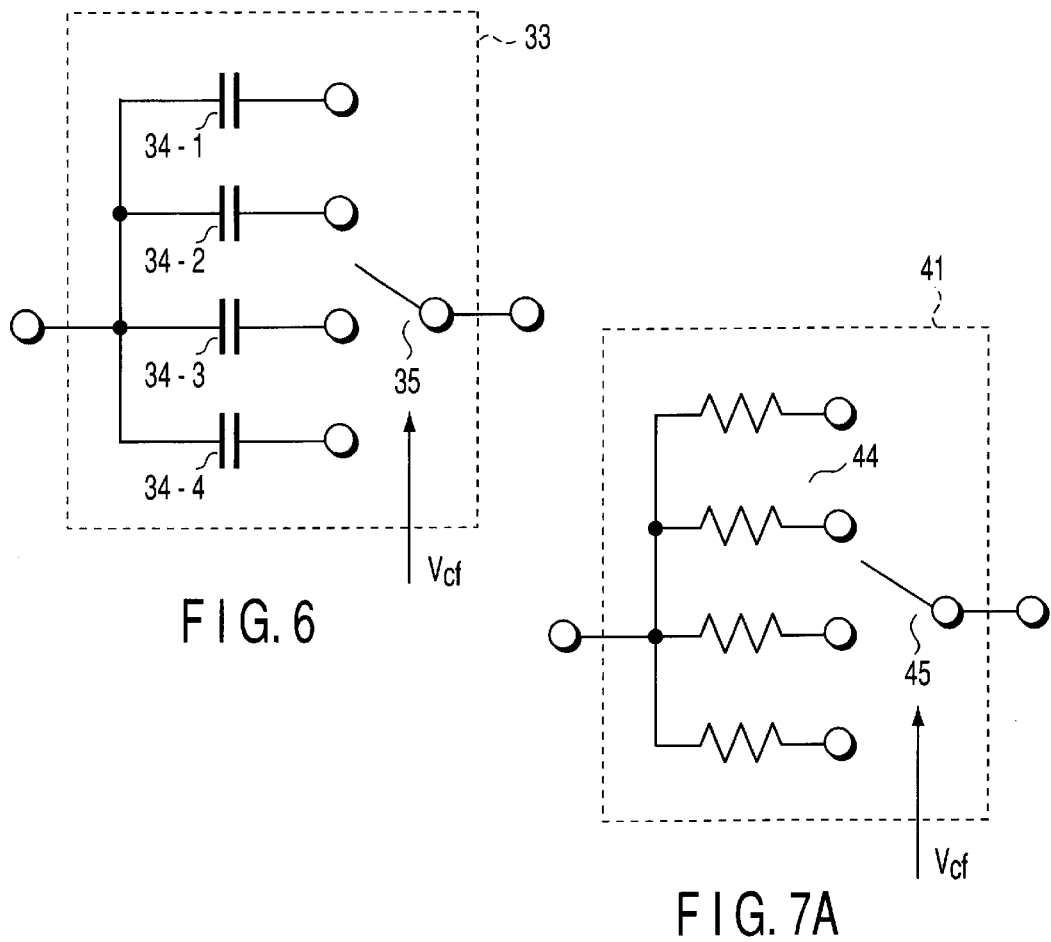
FIG. 6
FIG. 7A

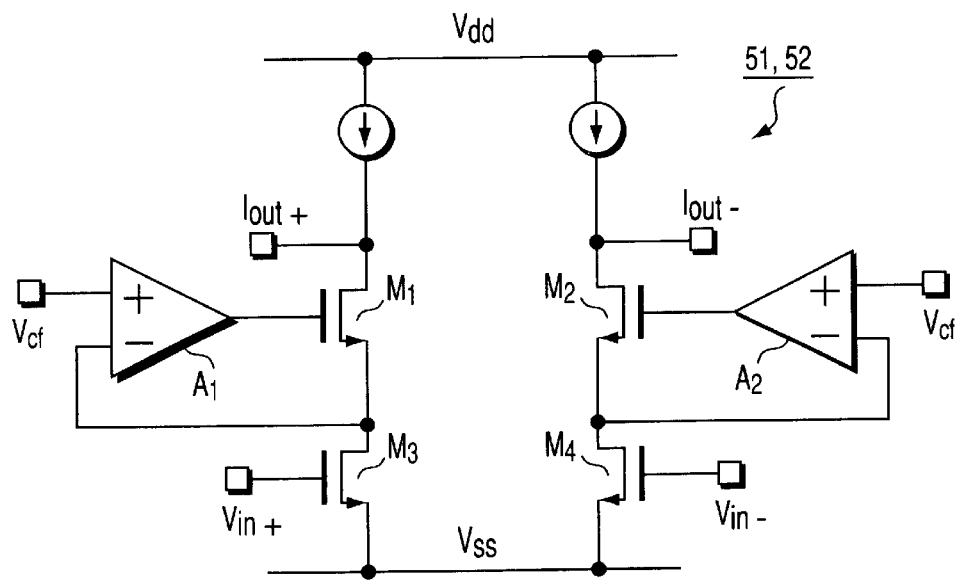
F I G. 9
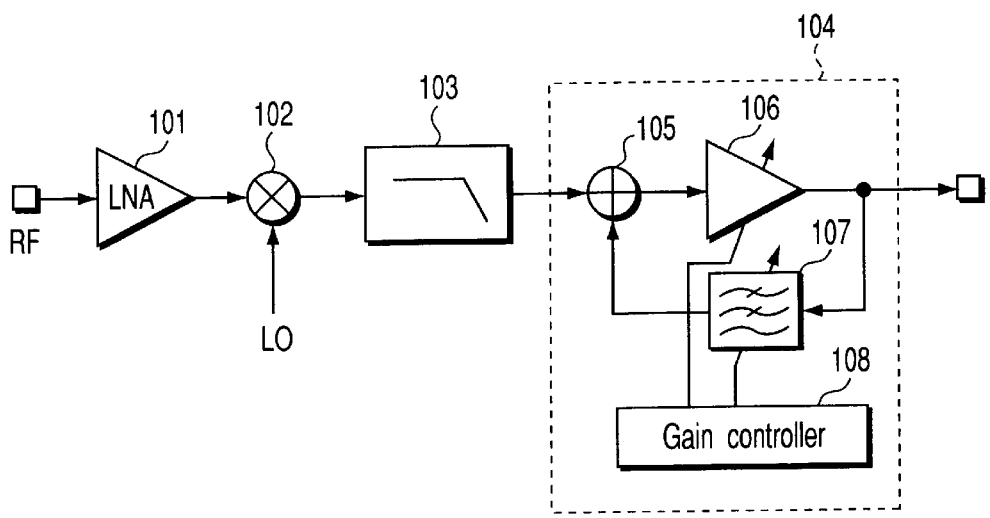
F I G. 10

VARIABLE GAIN AMPLIFIER

CROSS-REFERENCE TO RELATED APPLICATIONS

This application is based upon and claims the benefit of priority from the prior Japanese Patent Application No. 2001-295369, filed Sep. 27, 2001, the entire contents of which are incorporated herein by reference.

BACKGROUND OF THE INVENTION

1. Field of the Invention

The present invention relates to a variable gain amplifier used for cable broadcasting, radio communications, a magnetic recorder and so on, particularly to a variable gain amplifier provided with a dc offset canceling facility.

2. Description of the Related Art

Generally, it cannot be avoided in many amplifiers that the dc offset that is error components of a bias voltage and a bias current occurs in an output stage. So far various measures have been taken in order to remove this dc offset. There is, for example, an offset canceling system for removing the offset using a feedback amplifier circuit. In this case, the low frequency domain of the frequency band of a signal amplified by a predetermined gain (referring to as a lower limit frequency) fluctuates according to a change of the gain of the main amplifier. The frequency band of the amplified signal is narrower as this predetermined gain increases. Therefore, the low frequency domain of the signal that should be amplified at a high gain is not amplified, resulting in deteriorating quality of the signal.

It is an object of the present invention to provide a variable gain amplifier that can suppress fluctuation of a lower limit frequency according to change of the gain of a main amplifier circuit, and realize a good offset canceling.

BRIEF SUMMARY OF THE INVENTION

According to the first aspect of the present invention, there is provided a variable gain amplifier device comprising: a variable gain amplifier circuit supplied with an input signal and a feedback signal to amplify a difference between the input signal and the feedback signal and output an output signal; a feedback circuit which supplies the feedback signal to the variable gain amplifier circuit; and a controller which controls the variable gain amplifier circuit and the feedback circuit to decrease a cutoff frequency of the feedback circuit with an increase of the gain of the variable gain amplifier circuit or vice versa.

According to the second aspect of the present invention, there is a variable gain amplifier device comprising: a variable gain amplifier circuit supplied with an input signal and a feedback signal to amplify a difference between an input signal and a feedback signal and output an output signal; a feedback circuit which supplies the feedback signal to the variable gain amplifier circuit; and a controller which controls the gain of the variable gain amplifier circuit and a cutoff frequency of the feedback circuit to make a lower limit frequency of the output signal substantially constant regardless of variation of a gain of the variable gain amplifier circuit.

According to the third aspect of the present invention, there is provided a variable gain amplifier device comprising: a variable gain amplifier circuit supplied with an input signal and a feedback signal to amplify a difference between the input signal and the feedback signal and output an output signal, a gain of the variable gain amplifier circuit being varied according to a level of the input signal; and a feedback circuit which supplies the feedback signal to the variable gain amplifier circuit, a cutoff frequency of the feedback circuit being varied according to variation of the gain of the variable gain amplifier circuit to make a lower limit frequency of the output signal substantially constant.

BRIEF DESCRIPTION OF THE SEVERAL VIEWS OF THE DRAWING

FIG. 5 is a circuit diagram of another feedback amplifier circuit;

FIG. 6 shows a circuit diagram of a variable capacitor;

FIGS. 7A and 7B show circuit diagrams of different variable resistors;

FIG. 9 shows a circuit diagram of another voltage-to-current converter; and

FIG. 10 shows a block diagram of a radio receiver using the variable gain amplifier.

DETAILED DESCRIPTION OF THE INVENTION

There will now be described an embodiment of the present invention in conjunction with the drawings.

Figure 1:
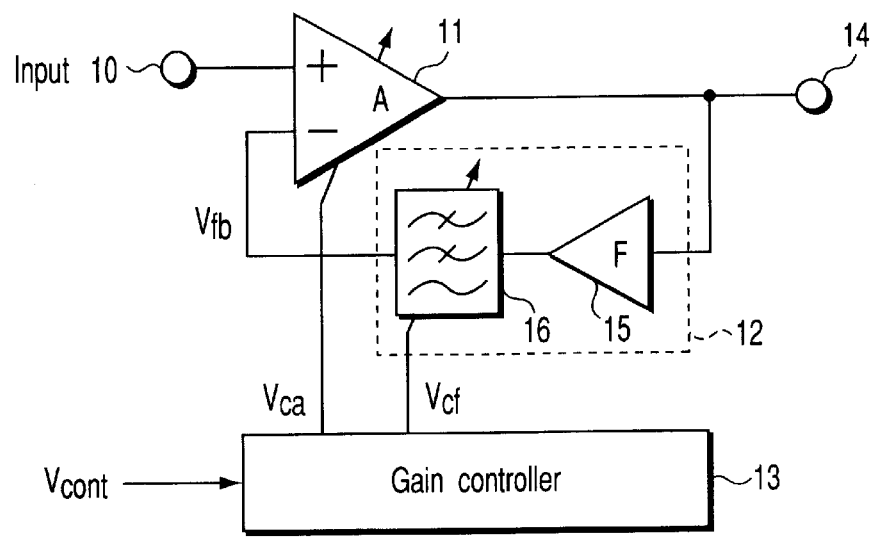
FIG. 1 is a block diagram of a variable gain amplifier related to an embodiment of the present invention.

As shown in FIG. 1, a variable gain amplifier comprises a main amplifier circuit 11 of a variable gain A, a feedback amplifier circuit 12 whose input is connected to the output terminal of the main amplifier circuit 12, and a gain control circuit 13 connected to the control input terminals of the main amplifier circuit 11 and feedback amplifier circuit 12. The feedback amplifier circuit 12 includes a sub-amplifier circuit 15 of a constant gain F and a low pass filter circuit 16 of a variable pass band that is connected to the output terminal of the sub-amplifier circuit 15. The gain control circuit 13 controls the gain of the main amplifier circuit 11 and the pass band of the low pass filter circuit 16.

An input signal supplied to an input terminal 10 is input to the non-inverting input terminal of the main amplifier circuit 11. The output signal of the main amplifier circuit 11 is input to an output terminal 14 and the feedback amplifier circuit 12. The output signal of the feedback amplifier circuit 12 is input to the inverting input terminal of the main amplifier circuit 11 as a feedback signal. The signal input to the feedback amplifier circuit 12 is amplified by the sub-amplifier circuit 15. Only a DC component is extracted from the amplified input signal by the low pass filter circuit 16. The DC component output from the feedback amplifier circuit 12 is input to the inverting input terminal of the main amplifier circuit 11. As a result, the DC component negates the dc offset component of the input signal input to the noninverting input terminal. In this way, the dc offset component is canceled.

The gain of the main amplifier circuit 11 is controlled by the control signal Vca generated from the gain control circuit 13 according to a signal Vcont corresponding to a level of the output signal, and at the same time the lower cutoff frequency of the low pass filter 16 is controlled by the control signal Vcf from the gain control circuit 13, too. In addition, the switching of the gain may refer to either output or input of the main amplifier circuit 11.

Figure 2:
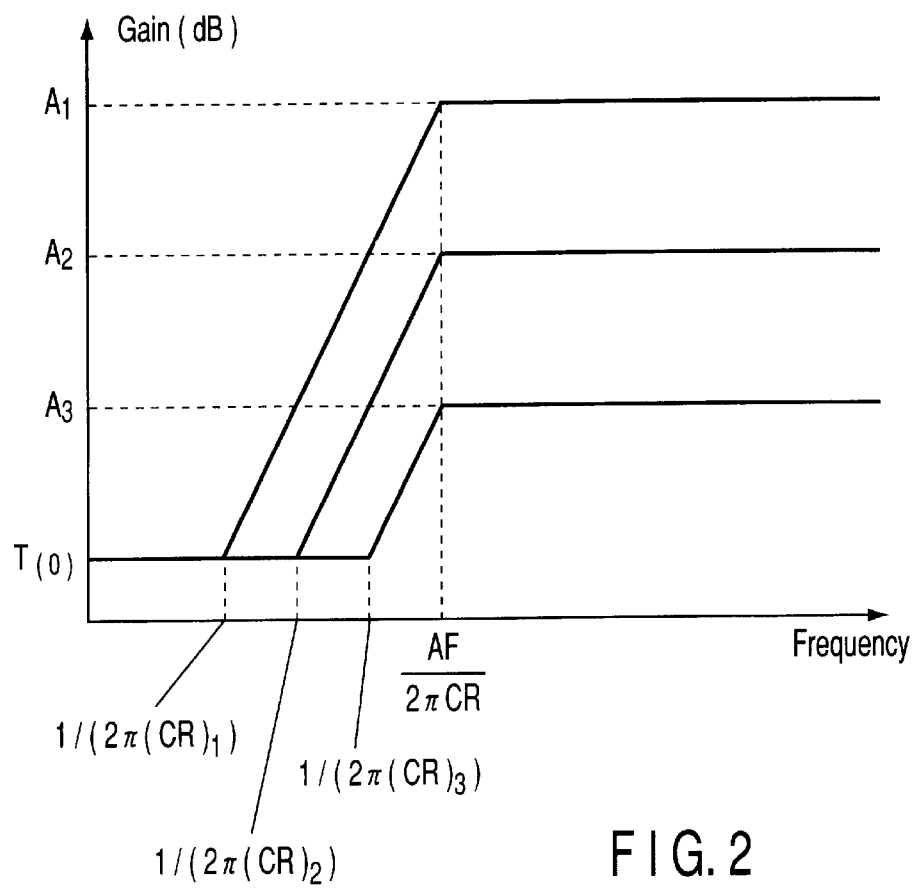
FIG. 2 is a graph to show a gain-frequency characteristic of the variable gain amplifier shown in FIG. 1.

When the gain control circuit 13 supplies the control signal Vca to the main amplifier 11 to increase the gain of the main amplifier circuit 11, it supplies the control signal Vcf to the low pass filter 16 to lower the cutoff frequency of the low pass filter 16 simultaneously. The input-output characteristics of this variable gain amplifier be expressed by the following equation (1):

$$T(s)=(A1+CRs)/(FA+1+CRs) \quad (1)$$

where A represents the gain of the main amplifier circuit 11, F expresses the gain of the sub-amplifier circuit 15 (the gain of band pass of the low pass filter is 1 time), and CR expresses a time constant corresponding to the cutoff frequency ($fo=1/(2\pi CR)$) of the low pass filter circuit 16. Assume that the main amplifier circuit 11 and low pass filter 16 are controlled so that A/CR becomes constant since F is constant. A big difference in transfer characteristic between the prior art variable gain amplifier and the variable gain amplifier of the present embodiment is that the time constant CR varies with the gain A simultaneously. The graph expressing this condition as the frequency characteristic is shown in FIG. 2. In other words, $1/(2\pi(CR)_1)$ is the cutoff frequency fo indicating a DC gain T at the time when the gain A of the main amplifier circuit 11 is A1. Similarly, $fo=1/(2\pi(CR)_2)$ when the gain is A2, and $fo=(2\pi(CR)_3)$ when the gain A is A3.

The lower limit frequency capable of maintaining the gain A (strictly the frequency that the gain becomes $A/\sqrt{2}$ time) is expressed by $AF/(2\pi CR)$. In other words, in the case of the present embodiment, it is found that even if the gain A changes to A1, A2, or A3, the lower limit frequency $AF/(2\pi CR)$ does not vary. As alternated, the frequency intersecting the DC gain T(0) ($\cong 1/F$) is shifted according to the gain A in order to vary CR according to gain A. However, this do not influence the DC gain (dc offset attenuation) T(0).

There will now be described the feedback amplifier circuit 12 having a low pass filter function capable of changing the cutoff frequency.

(The First Embodiment)

Figure 3:
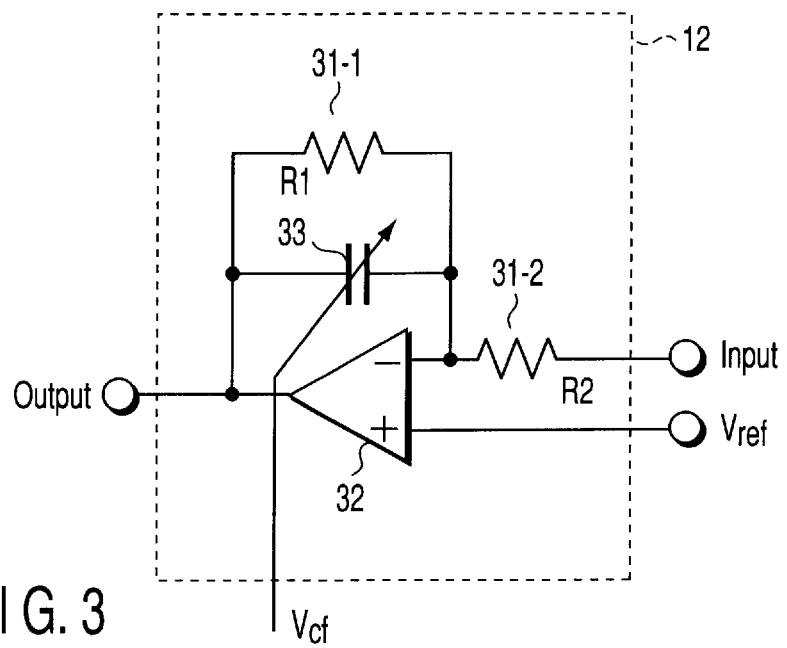
FIG. 3 is a circuit diagram of a feedback amplifier circuit of the first example.

FIG. 3 shows a circuit diagram of a feedback amplifier circuit 12 according to the first embodiment. The feedback amplifier circuit 12 comprises an operational amplifier 32, a variable capacitor 33 and a first resistor (resistance R) 31-1 which are connected in parallel between the output terminal and inverting input terminal of the operational amplifier 32, and a second resistor 31-2 connected between the input terminal and the inverting input terminal of the operational amplifier 32. Further, the output signal of the main amplifier circuit 11 of FIG. 1 is input to the inverting input terminal of the operational amplifier 32 via the second resistor (resistance R2) 31-2. A reference voltage Vref is applied to the non-inverting input terminal of the operational amplifier 32. This reference voltage Vref is a DC voltage used for an operation of the operational amplifier 32, and does not influence an operation of the variable gain amplifier of the present invention directly.

The low pass filter 16 comprises the operational amplifier 32, the variable capacitor 33 and the second resistor 31-2. The second amplifier circuit 15 comprises the first and second resistors 31-1 and 31-2 and the operational amplifier 32.

The cutoff frequency of the filter 16 is lowered by increasing the capacity of the variable capacitor 33 according to increase of the gain A of the main amplifier circuit 11. In addition, the gain F of the sub-amplifier circuit 15 is determined by R1/R2.

The variable capacitor 33 uses a capacitor unit wherein capacitors are switched as shown in FIG. 6 The first terminals of a plurality of capacitors, for example, four capacitors 34 are connected to each other, and the second terminals of the capacitors are connected to the contacts of the switch 35 respectively. The switch 35 is switched by the control signal Vcf supplied from the gain division circuit 13. The switch 35 may be constructed by CMOS transistors.

(The Second Embodiment)

Figure 4:
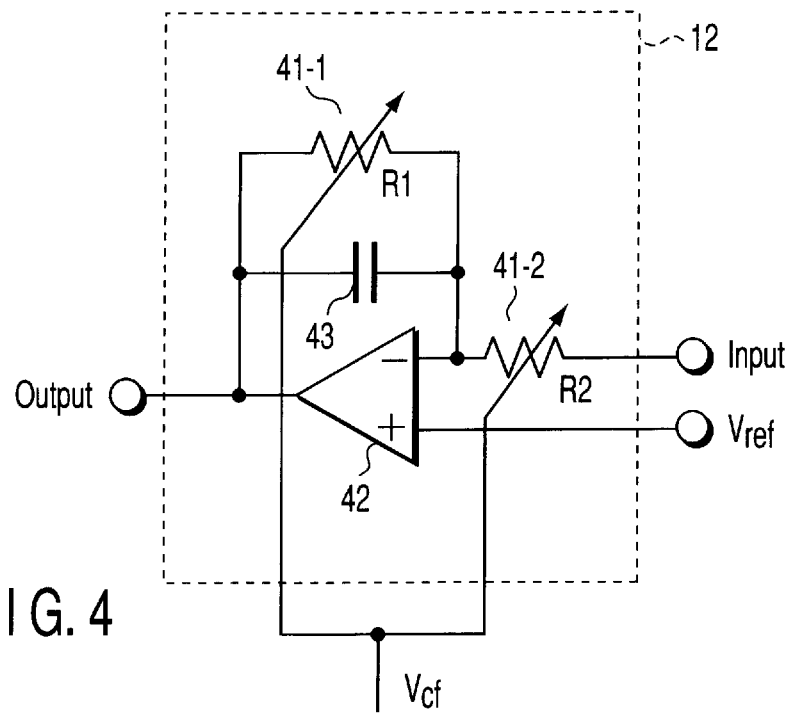
FIG. 4 is a circuit diagram of another feedback amplifier circuit.

FIG. 4 shows a circuit diagram of the feedback amplifier circuit 12 according to the second embodiment. This feedback amplifier circuit 12 is fundamentally the same as that shown in FIG. 3. This feedback amplifier circuit 12 controls a resistor instead of controlling a capacitor. In other words, the cutoff frequency of the filter 16 is lowered by increasing the resistance of the resistor 41-2 according to increase of the gain of the main amplifier circuit. Also, the cutoff frequency of the filter 16 is increased by decreasing the resistance of the resistor 41-2 according to decrease of the gain of the main amplifier circuit. In order to make the gain F of the feedback amplifier circuit 12 constant, two variable resistors 41-1 and 41-2 are adjusted so as to keep the resistance ratio between the variable resistors 41-1 and 41-2 at a constant value.

Figure 7B:
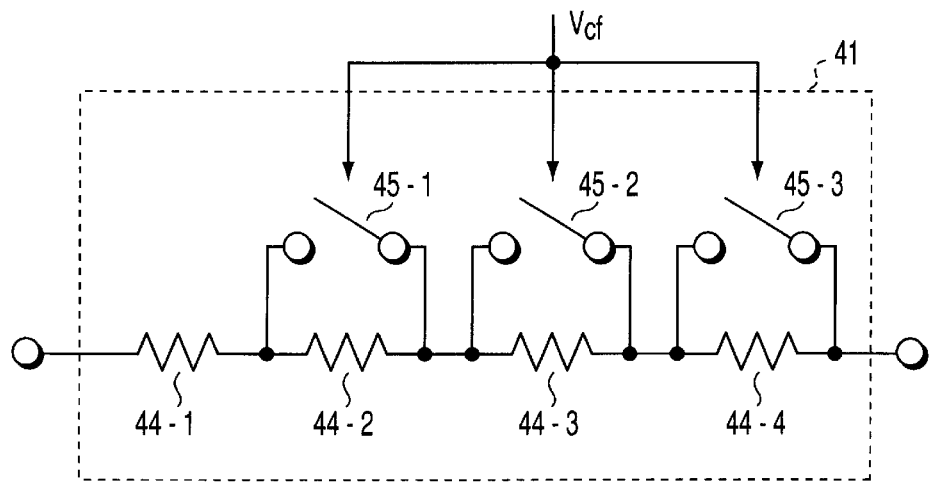

FIGS. 7A and 7B each show a concrete configuration of the variable resistor 41. FIG. 7A shows the variable resistor 41 wherein a plurality of, for example, four resistors are connected in parallel and switched by a switch 45. FIG. 7B shows the variable resistor 41 wherein a plurality of, for example, four resistors are connected in series and short-circuited by switches 45-1, 45-2 and 45-3. The switch may be constructed by CMOS transistors. The on-resistance of a CMOS transistor or a pseudo resistor circuit constructed by a voltage-to-current converter may be used instead of the variable resistor 41.

(The Third Embodiment)

FIG. 5 shows a circuit diagram of the feedback amplifier circuit 12 related to the third embodiment. The present embodiment differs from the first or the second embodiment, and the feedback amplifier circuit 12 comprises voltage-to-current converters 51 and 52, the mutual conductance of each of which is variable, and a capacitor 53 without using the operational amplifier and resistor. The first voltage-to-current converter 51 converts an input signal voltage to a current proportional to the signal voltage. A capacitor 53 is connected between the inverting and noninverting output terminals of the first voltage-to-current converter 51. The capacitor 53 short-circuits between the input terminals of the second voltage-to-current converter 52 and between the output terminals thereof. This second voltage-to-current converter 52 acts equivallently to a resistor.

The second voltage-to-current converter 52 and capacitor 53 construct a next stage low pass filter circuit 16 having a signal gain as shown in FIG. 1. When the mutual conductances of the voltage-to-current converters 51 and 52 are represented by Gm1 and Gm2 respectively, the signal gain F of the sub-amplifier circuit shown in FIG. 1 becomes Gm1/Gm2. The cutoff frequency is expressed by $Gm2/2\pi C$. C expresses the capacitance of the capacitor 53. When the gain A of the main amplifier circuit 11 is increased by the gain control signal Vcf from the gain control circuit 13, the voltage-to-current converters 51 and 52 are controlled by the gain control signal Vcf so that the conductances Gm1 and Gm2 are decreased at the same rate simultaneously. The reason why the conductances Gm1 and Gm2 are decreased at the same ratio simultaneously is to keep the gain F at a constant value. Further, when Gm2 is decreased, the equivalent resistance R (=1/Gm2) increases. Therefore, the cutoff frequency (fo (=1/(2πCR)) lowers as the signal gain F of the feedback amplifier circuit 12 keeps a constant value. On the contrary, the feedback amplifier circuit 12 is controlled by the gain control signal Vcf so that the conductances Gm1 and Gm2 increase when the signal gain A of the main amplifier circuit 11 decreases.

Figure 8:
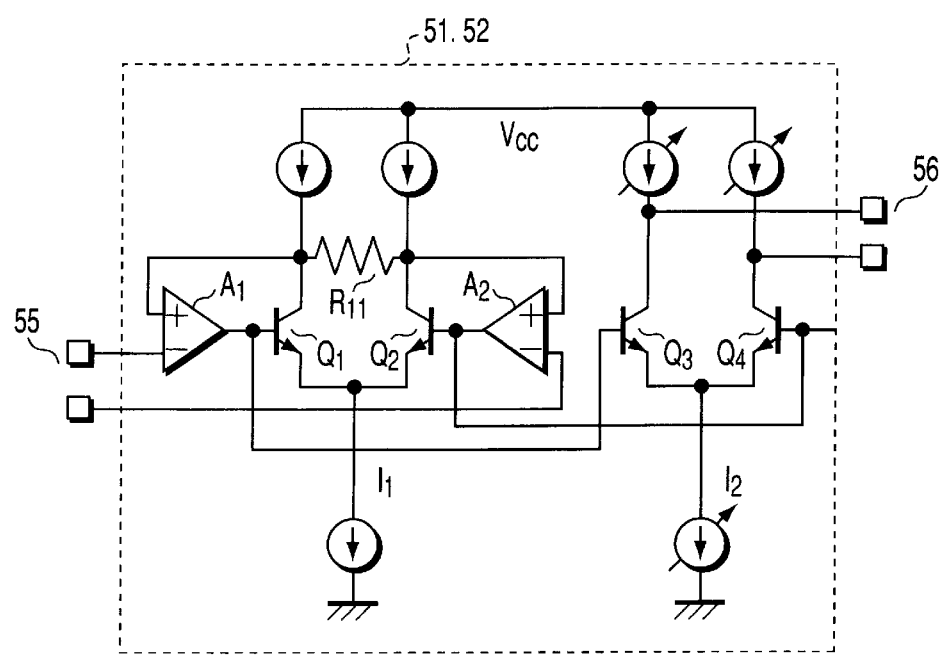
FIG. 8 shows a circuit diagram of a voltage-to-current converter.

FIGS. 8 and 9 show concrete circuits of the voltage-to-current converters 51 and 52 using the feedback amplifier circuit 12 shown in FIG. 5. FIG. 8 shows the voltage-to-current converter fabricated by bipolar transistors, and FIG. 9 shows the voltage-to-current converter fabricated by MOS transistors. In the voltage-to-current converter of FIG. 8, the collectors of bipolar transistors Q1 and Q2 are connected to current sources, and a resistor R11 is connected between the collectors. The emitters of the transistors Q1 and Q2 are grounded through a current source. The bases of the transistors Q1 and Q2 are connected to the output terminals of differential amplifier A1 and A2. The noninverting input terminals of the differential amplifiers A1 and A2 are connected to the collectors of the transistors Q1 and Q2, respectively. The inverting input terminal of the differential amplifier A1 is connected to one of input terminals 55. The inverting input terminal of the differential amplifier A2 is connected to the base of the transistor Q2. The collectors of bipolar transistors Q3 and Q4 are connected to variable current sources, and to output terminals 56 respectively. The emitters of the transistors Q3 and Q4 are grounded through a variable current source. The base of the transistor Q3 is connected to the base of the transistor Q1. The base of the transistor Q4 is connected to the other of the input terminals 55. The current proportional to the signal voltage input to the input terminal 55 is output from the output terminal 56. The mutual conductance of this circuit is expressed by the following equation (2).

$$Gm1, Gm2 = I2/(I1*R1) \quad (2)$$

In other words, the conductances Gm1 and Gm2 can be controlled by changing a ratio between currents I1 and I2. However, since the input operative range is determined by I1*R1, the input operative range varies if the current I1 is changed. Therefore, it is desirable to vary only the current I2.

In the voltage-to-current converter of FIG. 9, the drains of MOS transistors M1 and M2 are connected to current sources and to output terminals Iout⁺ and Iout⁻ respectively. The sources of the transistors M1 and M2 are connected to a voltage source Vss via drain-source paths of MOS transistors M3 and M4, respectively. The gates of the transistors M1 and M2 are connected to the output terminals of differential amplifiers A1 and A2 respectively. The gates of transistors M3 and M4 are connected to input terminals Vin⁺ and Vin⁻, respectively. The noninverting input terminals of the differential amplifiers A1 and A2 are connected to Vcf terminals, respectively. The inverting input terminals of the differential amplifiers A1 and A2 are connected to the sources of the transistors M1 and M2 respectively. An input voltage is applied between the input terminals Vin⁺ and Vin⁻, and an output current is extracted from output terminals Iout⁺ and Iout⁻.

The mutual conductances Gm1 and Gm2 of the voltage-to-current converter can be changed by controlling the mutual conductances of transistors M3 and M4. Assuming that the operating point is determined so that the transistors M3 and M4 operate in a linear domain, the mutual conductances of the transistor M3 and M4 are proportional to the drain-source voltages of the transistors M3 and M4. Therefore, the mutual conductance is controlled by controlling the drain voltages of the transistors M3 and M4.

By a feedback configuration of the operational amplifiers A1 and A2 and transistors M1 and M2, the feedback amplifier 12 operates so that the source voltages of the transistors M1 and M2 and voltages applied to the non-inverting input terminals of the operational amplifiers A1 and A2 become equal. The drain voltages of the transistors M3 and M4 are controlled by the voltages applied to the non-inverting input terminals of the operational amplifiers A1 and A2. Therefore, it is possible to change the mutual conductances of the voltage-to-current converters 51 and 52 by applying the control signal Vcf from the gain control circuit 13 to the non-inverting input terminals of the operational amplifiers A1 and A2.

An embodiment applied the present invention to a direct conversion radio receiver will be described hereinafter.

According to the FIG. 10, the output terminal of a low noise amplifier 101 to which a radio signal is input is connected to one input terminal of a multiplier 102. A local signal LO is input to the other input terminal of the multiplier 102. The output terminal of the multiplier 102 is connected to a variable gain amplifier 104 through a low pass filter 103. This variable gain amplifier 104 corresponds to the variable gain amplifier shown in FIG. 1. In other words, the variable gain amplifier 104 includes an amplifier 106 and a low pass filter 107 connected to the output terminal of an adder 105 to which a signal from the filter 103 is input, an amplifier 106 connected to the output terminal of the adder, a feedback circuit including a low pass filter 107 and feeding back the output signal of the amplifier 106 to the adder 105, and a gain controller 108.

According to the above radio receiver, a radio frequency signal RF is amplified by the amplifier 101, and multiplied with a local signal LO by the multiplier 102 to generate a multiplied signal. The low pass filter 103 filters the multiplied signal to generate a baseband signal to be input to the variable gain amplifier 104. In the variable gain amplifier 104, the baseband signal is input to the amplifier 106 via the adder 105 and amplified by the amplifier 106. The amplified signal is output as an output signal via an output terminal and fed back to the adder 105 via the filter 107. In the above operation, when the gain of the amplifier 106 is increased or decreased according to the signal from the filter 103 by the gain controller 108, the cutoff frequency of the low pass filter 107 is decreased or increased by the gain controller 108 simultaneously. As a result, the fluctuation of the lower cutoff frequency of the output signal is suppressed to realize a good offset canceling.

The present invention is not limited to the above embodiments and may be modified appropriately. In the above embodiments, the gain F of the sub-amplifier circuit is constant. However, the gain F of the sub-amplifier circuit is not limited to be constant. In other words, when the gain of the main amplifier circuit 11 is A, the low limit cutoff frequency is AF/(2πCR). The purpose of the present embodiment is directed to making this lower cutoff frequency constant if the gain A is changed. Therefore, the gain F may be varied in the scope that does not deviate from this purpose.

The variable gain amplifier related to the present embodiment is used for a mobile communication system that fluctuation of the lower signal bandwidth is not allowed in controlling a gain.

According to the present invention, there is provided a variable gain amplifier which suppresses fluctuation of the lower cutoff frequency due to the change of a gain if the gain of a main amplifier is changed, realizes a good offset cancel, and can integrated in a semiconductor chip.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A variable gain amplifier device comprising:
    a variable gain amplifier circuit supplied with an input signal and a feedback signal to amplify a difference between the input signal and the feedback signal to output an output signal;
    a feedback circuit which supplies the feedback signal to the variable gain amplifier circuit; and
    a controller which controls the variable gain amplifier circuit and the feedback circuit to decrease a cufoff frequency of the feedback circuit with an increase in a gain of the variable gain amplifier circuit or vice versa.

2. A variable gain amplifier device according to claim 1, wherein the feedback circuit outputs, as the feedback signal, only a predetermined low frequency component in frequency components of the output signal of the variable gain amplifier circuit.

3. A variable gain amplifier device according to claim 1, wherein the controller supplies a first control signal to the variable gain amplifier circuit to increase the gain of the variable gain amplifier circuit and a second control signal to the feedback circuit to decrease the cutoff frequency of the feedback circuit simultaneously or a first control signal to the variable gain amplifier circuit to decrease the gain of the variable gain amplifier circuit and a second control signal to the feedback circuit to increase the cutoff frequency of the feedback circuit simultaneously.

4. A variable gain amplifier device according to claim 1, wherein the feedback circuit comprises an operational amplifier, a variable capacitor and a first resistor which are connected in parallel between an inverting input terminal and output terminal of the operational amplifier, and a second resistor connected between the inverting input terminal of the operational amplifier and an output terminal of the variable gain amplifier circuit, a capacitance of the variable capacitor increasing with an increase in the gain of the variable gain amplifier and decreasing with a decrease of the gain of the variable gain amplifier.

5. A variable gain amplifier device according to claim 1, wherein the feedback circuit comprises an operational amplifier, a capacitor and a first resistor whose resistance is variable and which are connected in parallel between an inverting input terminal of the operational amplifier and an output terminal thereof, and a second resistor connected between the inverting input terminal of the operational amplifier and an output terminal of the variable gain amplifier circuit, the resistance of the first resistor increasing with an increase in the gain of the variable gain amplifier and decreasing with a decrease in the gain thereof.

6. A variable gain amplifier device according to claim 5, wherein the second resistor comprises a resistor whose resistance is variable, the resistance of the first resistor and the resistance of the second resistor increasing with an increase in the gain of the variable gain amplifier and decreasing with a decrease in the gain thereof as a constant resistance ratio is kept between the first resistor and the second resistor.

7. A variable gain amplifier device according to claim 1, wherein the feedback circuit comprises a first voltage-current converter, a capacitor connected to an output terminal of the first voltage-current converter, and a second voltage-current converter whose mutual conductance is variable and which includes an input terminal connected to the capacitor and an output terminal, the input terminal and the output terminal being short-circuited, and the mutual conductance of the second voltage-current converter decreasing with an increase in the gain of the variable gain amplifier circuit or vice versa.

8. A variable gain amplifier device according to claim 7, wherein a mutual conductance of the first voltage-current converter is variable, the mutual conductance of the first voltage-current converter and the mutual conductance of the second voltage-current converter decrease at the same rate with an increase in the gain of the variable gain amplifier circuit or vice versa.

9. A radio receiver comprising:
    a baseband circuit which converts a radio signal into a baseband signal; and
    a variable gain amplifier device according to claim 1 which amplifies the baseband signal.

10. A variable gain amplifier device comprising:
    a variable gain amplifier circuit which amplifies a difference between an input signal and a feedback signal to output an output signal;
    a feedback circuit which supplies the feedback signal to the variable gain amplifier circuit; and
    a controller which controls the gain of the variable gain amplifier circuit and a cutoff frequency of the feedback circuit to make a lower limit frequency of the output signal substantially constant regardless of variation of a gain of the variable gain amplifier circuit.

11. A variable gain amplifier device according to claim 10, wherein the feedback circuit generates, as the feedback signal, only a predetermined low frequency component in frequency components of the output signal of the variable gain amplifier circuit.

12. A radio receiver comprising:
    a baseband circuit which converts a radio signal into a baseband signal; and
    a variable gain amplifier device according to claim 10 which amplifies the baseband signal.

13. A variable gain amplifier device comprising:
    a variable gain amplifier circuit supplied with an input signal and a feedback signal to amplify a difference between the input signal and the feedback signal and output an output signal, a gain of the variable gain amplifier circuit being varied according to a level of at least one of the output signal and the input signal; and
    a feedback circuit which supplies the feedback signal to the variable gain amplifier circuit, a cutoff frequency of the feedback circuit being varied according to variation of the gain of the variable gain amplifier circuit to make a lower limit frequency of the output signal substantially constant.

14. A variable gain amplifier device according to claim 13, wherein the feedback circuit generates, as the feedback signal, only a predetermined low frequency component in frequency components of the output signal of the variable gain amplifier circuit.

15. A radio receiver comprising:
a baseband circuit which converts a radio signal into a baseband signal; and
a variable gain amplifier device according to claim 13 which amplifies the baseband signal.

* * * * *